United States Patent
Lee et al.

(10) Patent No.: US 10,301,720 B2
(45) Date of Patent: May 28, 2019

(54) POLYMER THIN FILM WITH WATER REPELLENCY AND OIL REPELLENCY AND METHOD FOR PREPARING THE SAME

(71) Applicant: LG CHEM, LTD., Seoul (KR)

(72) Inventors: Eun Jeong Lee, Daejeon (KR); Ki-Hwan Kim, Daejeon (KR); Chan Hyoung Park, Daejeon (KR)

(73) Assignee: LG Chem, Ltd., Seoul (KR)

( * ) Notice: Subject to any disclaimer, the term of this patent is extended or adjusted under 35 U.S.C. 154(b) by 356 days.

(21) Appl. No.: 14/917,530

(22) PCT Filed: Dec. 5, 2014

(86) PCT No.: PCT/KR2014/011932
§ 371 (c)(1),
(2) Date: Mar. 8, 2016

(87) PCT Pub. No.: WO2015/084107
PCT Pub. Date: Jun. 11, 2015

(65) Prior Publication Data
US 2016/0215398 A1    Jul. 28, 2016

(30) Foreign Application Priority Data

Dec. 6, 2013   (KR) .................. 10-2013-0151759
Dec. 4, 2014   (KR) .................. 10-2014-0173000

(51) Int. Cl.
*C23C 16/44*   (2006.01)
*C23C 18/02*   (2006.01)
(Continued)

(52) U.S. Cl.
CPC ............. *C23C 18/02* (2013.01); *B05D 1/60* (2013.01); *B05D 5/083* (2013.01); *C23C 16/44* (2013.01); *B05D 1/34* (2013.01)

(58) Field of Classification Search
CPC ....................................... C23C 16/44
See application file for complete search history.

(56) References Cited

U.S. PATENT DOCUMENTS 6,358,557 B1   3/2002   Wang et al.
2010/0221188 A1*   9/2010   Clark ............. B82Y 15/00
                                            424/9.6
(Continued)

FOREIGN PATENT DOCUMENTS

EP   1520688 A1   4/2005
JP   2003510378 A   3/2003
(Continued)

OTHER PUBLICATIONS

Riche, Carson T. et al., "Vapor deposition of cross-linked fluoropolymer barrier coatings onto pre-assembled microfluidic devices", Lab Chip, 2011, 11, 3049-3052.
(Continued)

*Primary Examiner* — Elizabeth A Burkhart
(74) *Attorney, Agent, or Firm* — Dentons US LLP

(57) ABSTRACT

This disclosure relates to a method for preparing a polymer thin film with water repellency and oil repellency, including: thermally decomposing a thermal initiator to form a radical; reacting the radical with a monomer mixture of a specific composition to synthesize a polymer; and depositing the synthesized polymer on a substrate, and a polymer thin film with water repellency and oil repellency including a polymer resin including (meth)acrylate-based repeat units substituted with a fluorine-containing functional group and repeat units derived from a compound including at least two reactive functional groups at a specific ratio.

12 Claims, 10 Drawing Sheets

(51) Int. Cl.
  *B05D 5/08* (2006.01)
  *B05D 1/00* (2006.01)
  *B05D 1/34* (2006.01)

(56) References Cited

U.S. PATENT DOCUMENTS

| | | |
|---|---|---|
| 2012/0121858 A1 | 5/2012 | Kato |
| 2012/0177844 A1 | 7/2012 | Biver et al. |
| 2013/0280485 A1* | 10/2013 | Coclite ............... C09D 133/16 428/141 |
| 2014/0322455 A1 | 10/2014 | Im et al. |

FOREIGN PATENT DOCUMENTS

| | | |
|---|---|---|
| JP | 2009012310 A | 1/2009 |
| JP | 2013505354 A | 2/2013 |
| KR | 100241470 B1 | 2/2000 |
| KR | 1020050010064 A | 1/2005 |
| KR | 1020090041854 A | 4/2009 |
| KR | 1020120022816 A | 3/2012 |
| KR | 1020130103392 A | 2/2013 |
| KR | 1020130124617 A | 11/2013 |
| WO | 2014/127304 A1 | 8/2014 |

OTHER PUBLICATIONS

Bradley, Laura C. et al., "Formation of Heterogeneous Polymer Films via Simultaneous or Sequential Depositions of Soluble and Insoluble Monomers onto Ionic Liquids", Langmuir Aug. 6, 2013, pp. 10448-10454.

Yague, et al.: "Enhanced Cross-Linked Density by Annealing on Fluorinated Polymers Synthesized via Initiated Chemical Vapor Deposition to Prevent Surface Reconstruction", American Chemical Society, Macromolecules, vol. 46, 2013, pp. 6548-6554.

\* cited by examiner

[FIGURE 1]
Example 1
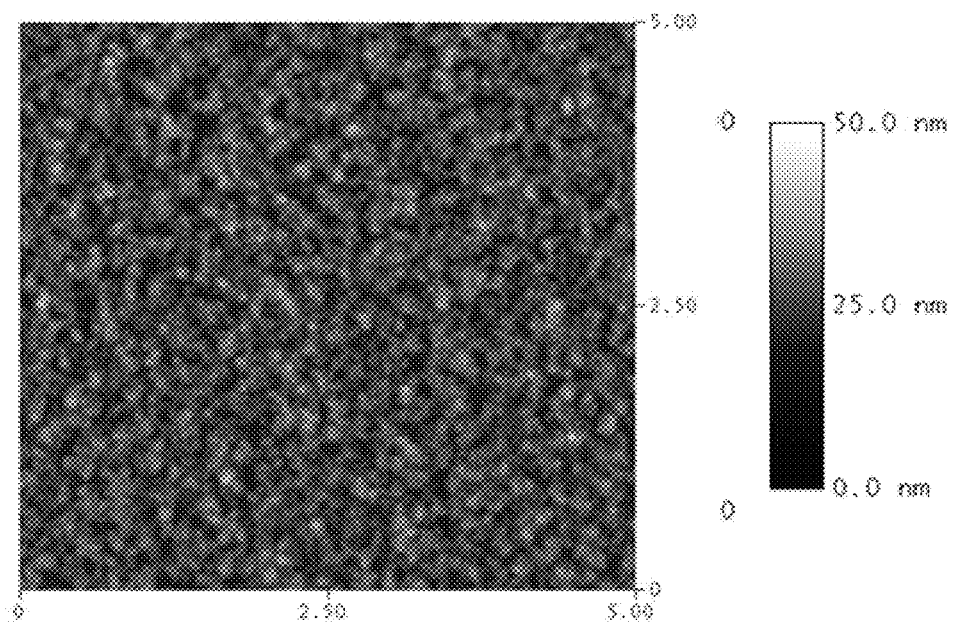

[FIGURE 2]
Example 2
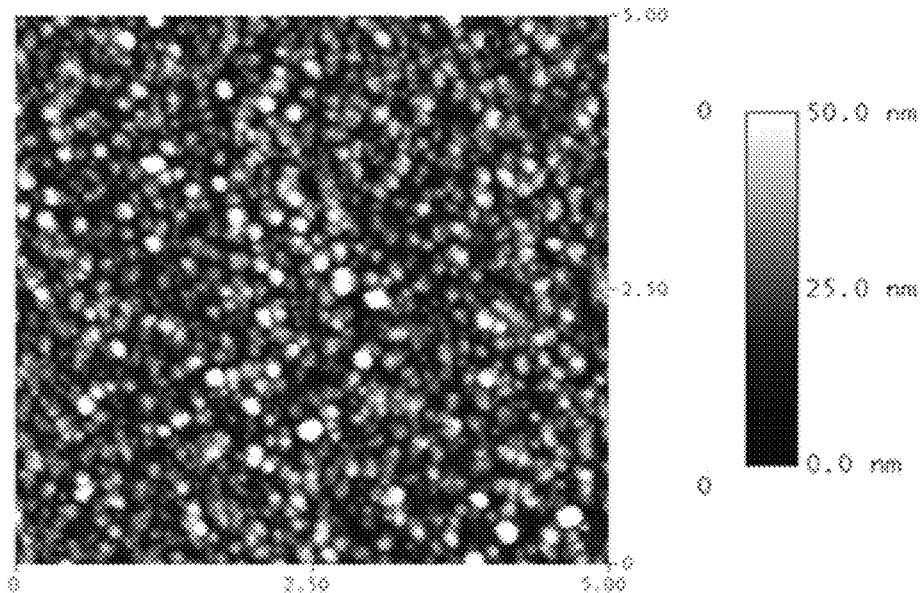

[FIGURE 3]
Example 3
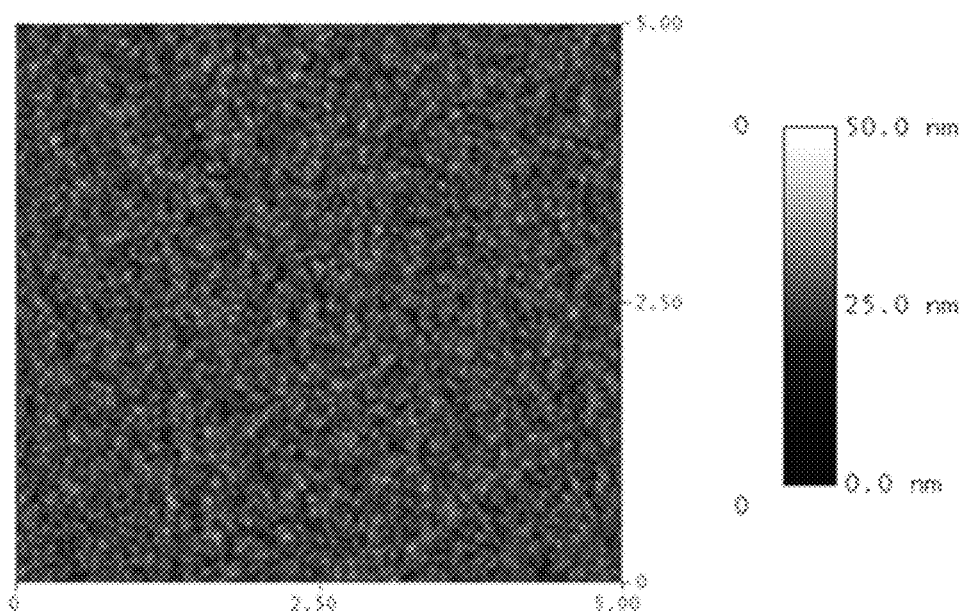

[FIGURE 4]
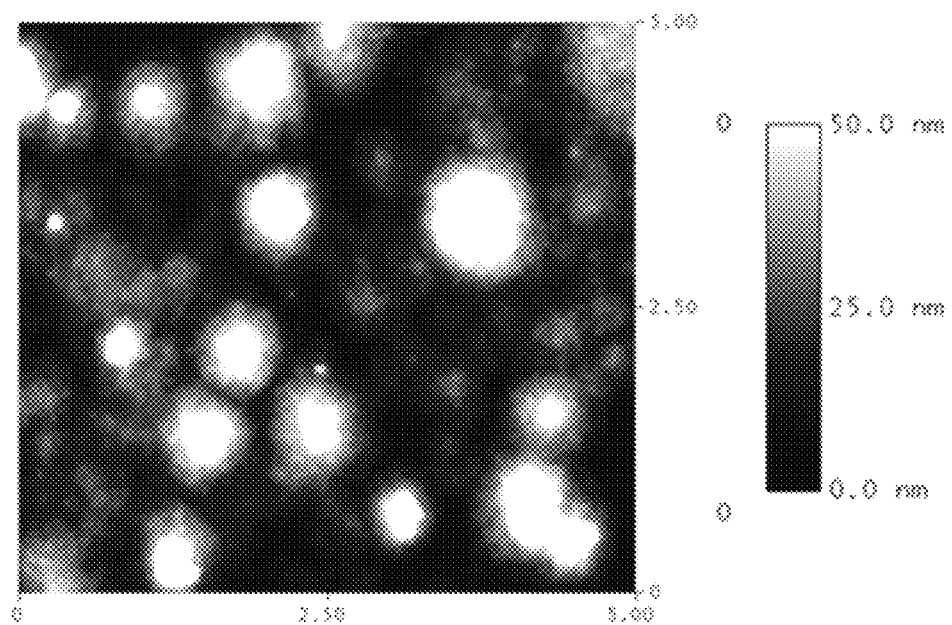

[FIGURE 5]
Comparative Example 2
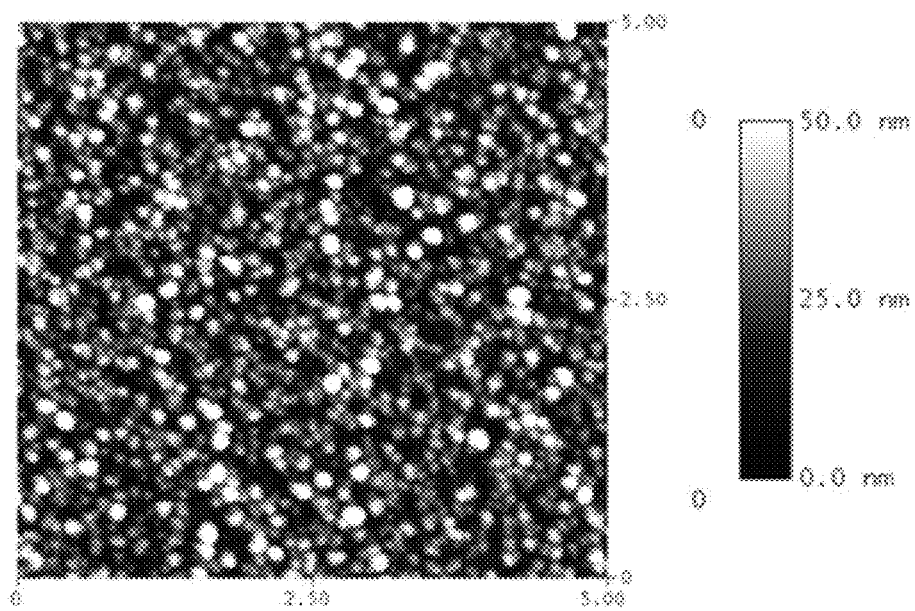

[FIGURE 6]
Comparative Example 3
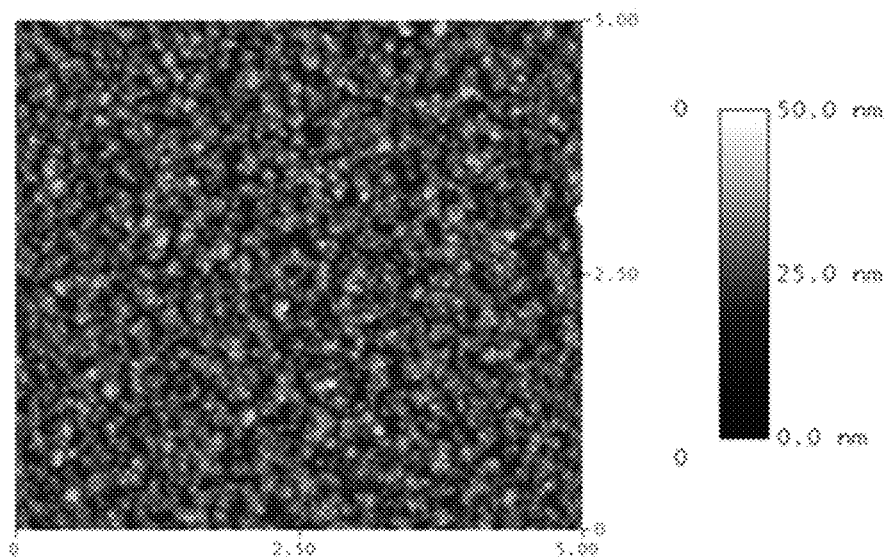

[FIGURE 7]
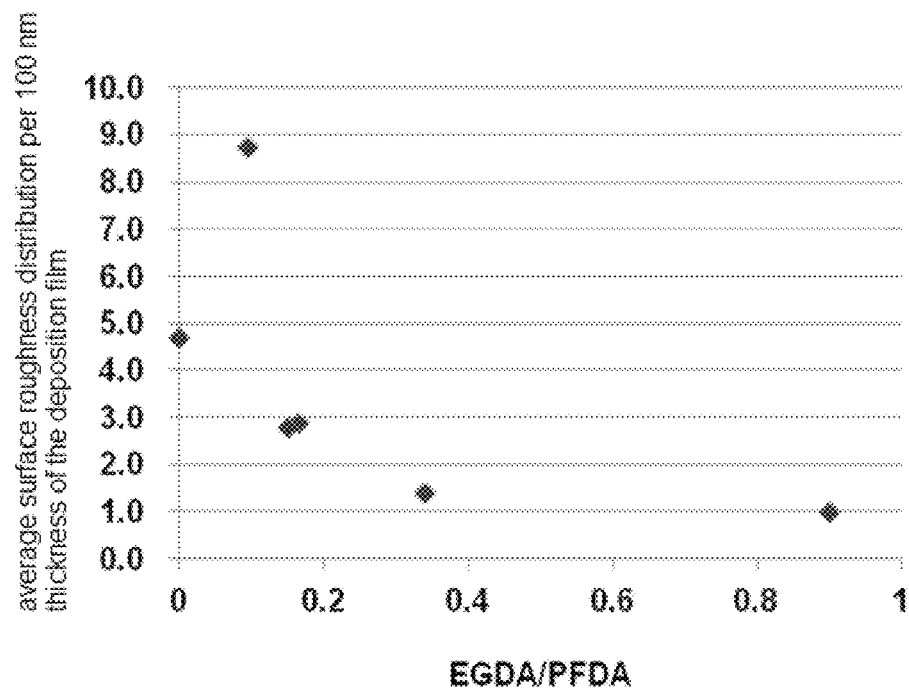

[FIGURE 8]
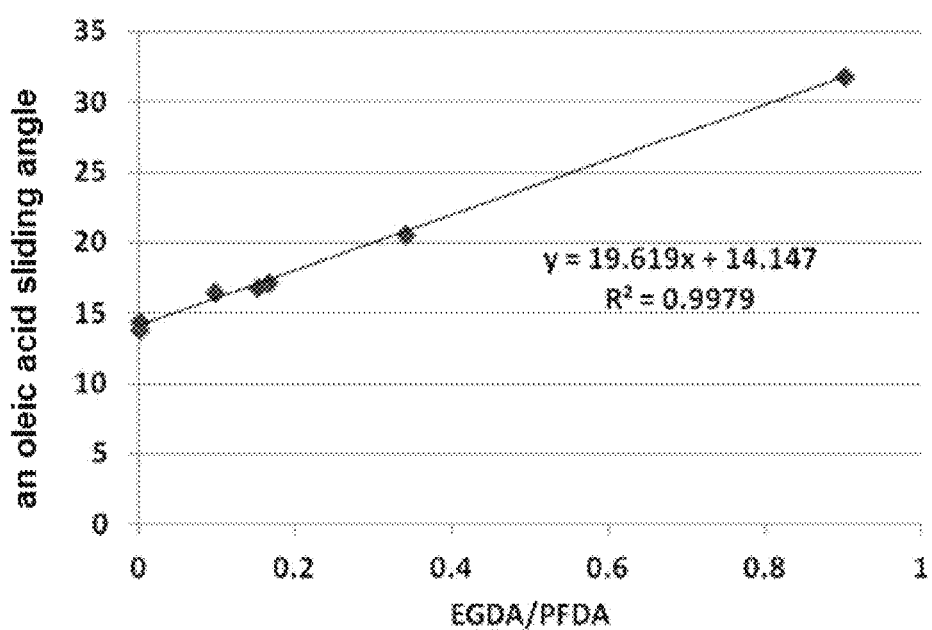

[FIGURE 9]
| | before heating | after heating |
| --- | --- | --- |
| | microscope(x100) | microscope(x100) |
| Comparative Example 2 | 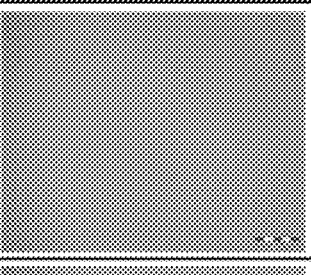 | 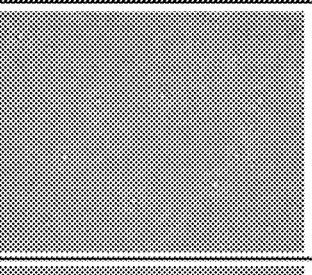 |
| Example 1 | 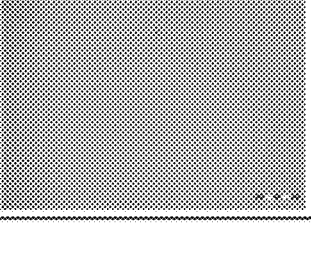 | 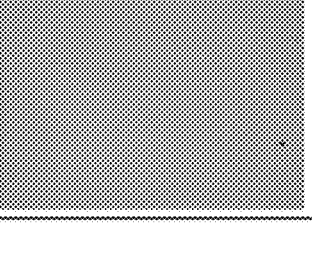 |

[FIGURE 10]
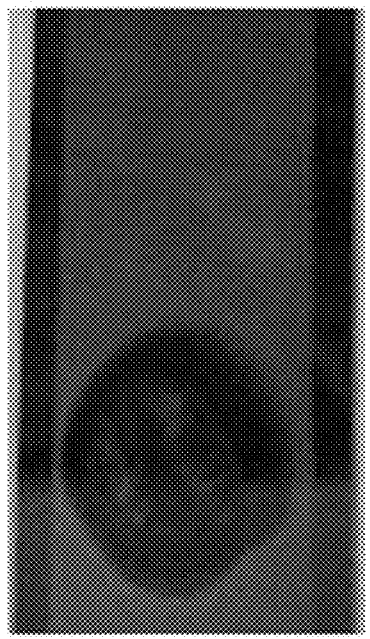
Comparative
Example 1
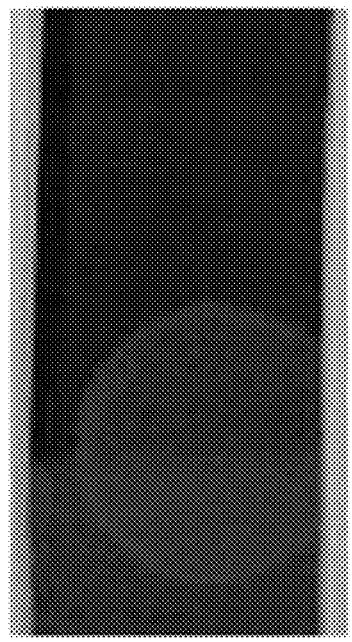
Example 1

POLYMER THIN FILM WITH WATER REPELLENCY AND OIL REPELLENCY AND METHOD FOR PREPARING THE SAME

This application is a National Stage Application of International Application No. PCT/KR2014/011932, filed Dec. 5, 2014, and claims priority to and the benefit of Korean Patent Application No. 10-2014-0173000, filed Dec. 4, 2014, Korean Patent Application No. 10-2013-0151759, filed Dec. 6, 2013, and the contents of which are incorporated by reference in their entirety for all purposes as if fully set forth below.

FIELD OF THE INVENTION

The present invention relates to a polymer thin film with water repellency and oil repellency, and a method for preparing the same.

BACKGROUND OF THE INVENTION

Chemical vapor deposition (CVD) is a process of applying a previously well-known liquid phase organic synthesis reaction for a gas phase reaction process. In this process, vaporized monomers are activated in a gas phase reactor and a polymerization reaction is conducted to form a polymer thin film on a substrate, and polymerization and thin film deposition are simultaneously achieved in a single process. Thus, it has a big advantage in that a uniform thin film may be formed while the polymer thin film maintains the shape of the substrate surface with a microsize or a nanosize.

Practically, a CVD process is one of the most important and widely used processes for the manufacture of a semiconductor device, and in general, it has been widely used for deposition of inorganic substances and the process is well developed. A CVD process has important advantages of formation of ultrahigh-purity thin films, controllability of interfacial properties, and the like. First of all, through the development experience of the existing CVD process, much knowledge required to control the physical properties of a thin film is well known. Thus, if the well-developed CVD process is extended to polymer materials with various functions, various dilemmas that were difficult to solve through the existing liquid phase process will be able to be solved by a CVD process of a polymer thin film.

In order to solve limitations of traditional deposition processes such as use of organic solvents or application of high temperature process conditions and the like, initiated chemical vapor deposition (iCVD) is being widely used. The iCVD process is a process of vaporizing an initiator and monomers to achieve a polymerization reaction in a gas phase, thereby depositing a polymer thin film on the surface of a substrate.

Since the iCVD process may form a film with a uniform thickness from the surface of a substrate, it may form a polymer thin film while maintaining the shape of a substrate of a complicated structure with a nanometer or micrometer size.

However, monomers known to be usable for the iCVD process are limited, and a polymer thin film formed from the monomers does not have sufficient mechanical properties or chemical resistance, thus there is a limit in affording functionalities such as oil repellency and water repellency and the like and applying them to a product.

DETAILED DESCRIPTION OF THE INVENTION

Technical Objectives

It is an object of the invention to provide a method for preparing a polymer thin film with water repellency and oil repellency, which has uniform physical properties and thickness over its whole area, and low average surface roughness and high durability and chemical resistance.

It is another object of the invention to provide a polymer thin film with water repellency and oil repellency, which has uniform physical properties and thickness over its whole area, and has low average surface roughness and high durability and chemical resistance.

TECHNICAL SOLUTIONS

A method for preparing a polymer thin film with water repellency and oil repellency is provided, including the steps of: thermally decomposing a thermal initiator of a gas phase to form a radical; reacting the formed radical with a monomer mixture including (meth)acrylate-based monomers substituted with a fluorine-containing functional group and a reactive compound including at least two vinyl groups or (meth)acrylate-based functional groups to synthesize a polymer; and depositing the synthesized polymer on a substrate, wherein a ratio of deposition partial pressure of the following General Formula 1 of the reactive compound including at least two vinyl groups or (meth)acrylate-based functional groups to deposition partial pressure of the following General Formula 1 of the (meth)acrylate-based monomers substituted with a fluorine-containing functional group is 0.10 to 0.80.

Deposition partial pressure=$P_m/P_{sat}$ [General Formula 1]

In the General Formula 1, Psat denotes saturation vapor pressure of corresponding monomers or compounds at a surface temperature of a substrate on which the synthesized polymer is deposited, and Pm denotes partial pressure of corresponding monomers or compounds in a reactor in which the deposition is progressed.

A polymer thin film is provided, including: a polymer resin including (meth)acrylate-based repeat units substituted with a fluorine-containing functional group; and repeat units derived from a reactive compound including at least two vinyl groups or (meth)acrylate-based functional groups at a mole ratio of 100:10 to 100:80, and having a static contact angle of 120° or more with 3 μl of distilled water and a static contact angle of 80° or more with 3 μl of oleic acid.

Hereinafter, a method for preparing a polymer thin film with water repellency and oil repellency and a polymer thin film with water repellency and oil repellency according to specific embodiments of the invention will be explained in detail.

As used herein, the term '(meth)acrylate' means both acrylate and methacrylate.

According to one embodiment of the invention, a method for preparing a polymer thin film with water repellency and oil repellency is provided, including the steps of: thermally decomposing a thermal initiator of a gas phase to form a radical; reacting the formed radical with a monomer mixture including (meth)acrylate-based monomers substituted with a fluorine-containing functional group and a reactive compound including at least two vinyl groups or (meth)acrylate-based functional groups to synthesize a polymer; and depositing the synthesized polymer on a substrate, wherein a ratio of deposition partial pressure of the General Formula 1 of the reactive compound including at least two vinyl groups or (meth)acrylate-based functional groups to deposition partial pressure of the General Formula 1 of the (meth)acrylate-based monomers substituted with a fluorine-containing functional group is 0.10 to 0.80, or 0.13 to 0.50.

The deposition partial pressure (Pm/Psat) of the General Formula 1 is a ratio of partial pressure of corresponding monomers or compounds in a reactor in which deposition is progressed to saturation vapor pressure of corresponding monomers or compounds at a surface temperature of a substrate on which deposition is progressed.

Specifically, in the General Formula 1, Psat denotes saturation vapor pressure of corresponding monomers or compounds at a surface temperature of a substrate on which the synthesized polymer is deposited, and Pm denotes partial pressure of corresponding monomers or compounds in a reactor in which the deposition is progressed.

A specific kind or shape of the reactor in which deposition is progressed is not particularly limited, and any deposition reactors or deposition chambers known to be usable for chemical vapor deposition may be used.

In the preparation method of one embodiment of the invention, the concentration of each reactant may be defined as the ratio of partial pressure of corresponding monomers or compounds in a reactor in which deposition is progressed to saturation vapor pressure of the monomers or compounds at a surface temperature of a substrate in which deposition is progressed, instead of partial pressure of introduced monomers or compounds.

The partial pressure of monomers or compounds in a reactor in which deposition is progressed may be obtained by multiplying the ratio of flow rate of corresponding monomers or compounds to total flow rate of introduced gas by deposition process pressure.

Further, the saturation vapor pressure of corresponding monomers or compounds at a surface temperature of a deposition substrate may be calculated by the Clausius-Clapeyron relation.

The inventors confirmed that the ratio of deposition partial pressure of the following General Formula 1 of a reactive compound including at least two vinyl groups or (meth)acrylate-based functional groups to deposition partial pressure of the following General Formula 1 of (meth) acrylate-based monomers substituted with a fluorine-containing functional group corresponds with the mole ratio of each repeat unit derived from each reactant in the finally prepared polymer thin film.

The inventors also confirmed that if the (meth)acrylate-based monomers substituted with a fluorine-containing functional group and the reactive compound including at least two vinyl groups or (meth)acrylate-based functional groups are subjected to a gas phase reaction in the presence of a radical of a thermal initiator under the above-explained specific deposition partial pressure, and the obtained polymer is deposited, a water repellent and oil repellent polymer thin film or polymer deposition thin film with low average surface roughness and high durability and chemical resistance may be obtained, and completed the invention.

In the polymer thin film with water repellency and oil repellency obtained by the preparation method, by-product generation is insignificant, an additional high temperature annealing process is not required after formation of the polymer thin film, and the remaining amount of non-reacted reactive functional groups is insignificant, thus affording stable surface properties.

The prepared polymer thin film has a high contact angle with organic components as well as with water, and thus may realize water repellency and oil repellency even at a flat surface without a three-dimensional structure, and when deposited on a surface with a reverse tapered three-dimensional structure and the like, may realize extreme water repellency and extreme oil repellency, thereby easily minimizing the amount of transferred pollutants and easily removing transferred pollutants.

Specifically, the prepared polymer thin film may have high water repellency and oil repellency, and for example, it may have a static contact angle of 120° or more, or a static contact angle of 120° to 140°, with 3 µl of distilled water, and a static contact angle of 80° or more, or a static contact angle of 80° to 120°, with 3 µl of oleic acid.

Further, the prepared polymer thin film may have sliding angle of 30° or less, or 3° to 30°, with 30 µl of oleic acid.

Since the prepared polymer thin film has lower interaction energy with liquids or organic substances, it has a relatively small sliding angle with liquids. For example, when 30 µl of oleic acid most similar to a fingerprint component is put on the polymer thin film, an angle at which the oleic acid begins to slide down while making an angle of inclination with a horizontal plane, that is, a sliding angle, may be 30° or less, or 3° to 30°. That is, since the polymer thin film exhibits low interaction energy with organic components or moisture components and also exhibits a low sliding angle with the above components, the amount of pollutants transferred on the surface may be largely reduced, transferred pollutants may be prevented from remaining on the surface, and the pollutants may be easily removed.

Furthermore, the prepared polymer thin film may have uniform surface properties, and specifically, average surface roughness of the polymer thin film may be 15 nm or less, or 0.1 nm to 15 nm.

Average surface roughness per 100 nm thickness of the polymer thin film may be 3 nm or less, or 0.1 to 3 nm. For example, the polymer thin film with a thickness of 200 nm may have average surface roughness of 6 nm or less.

As explained above, the prepared polymer thin film may have high mechanical surface properties and heat resistance. Specifically, pencil hardness of the prepared polymer thin film, as measured using a 500 g weight according to ASTM D3363, may be HB or higher, or HB to 2H.

The prepared polymer thin film may have a thickness of 10 nm to 1000 nm.

As explained above, the properties of the prepared polymer thin film may be obtained by progressing a reaction in the presence of a radical of a thermal initiator formed by thermal decomposition, while adjusting a ratio of deposition partial pressure of the General Formula 1 of the reactive compound including at least two vinyl groups or (meth) acrylate-based functional groups to deposition partial pressure of the General Formula 1 of the (meth)acrylate-based monomers substituted with a fluorine-containing functional group to 0.10 to 0.80, or 0.13 to 0.50.

A polymer thin film prepared only from the (meth) acrylate-based monomers substituted with a fluorine-containing functional group has a glass transition temperature (Tg) below room temperature, and thus has inferior thermal stability, and has low physical durability such that the film is removed or a deposition film is damaged even by light friction, for example, by touching with hands. Further, it has inferior chemical durability such as being easily dissolved in a fluorine-containing solvent, and surface roughness of the deposition film is relatively high such that a flat deposition film cannot be obtained.

However, by reacting the (meth)acrylate-based monomers substituted with a fluorine-containing functional group with the reactive compound including at least two vinyl groups or (meth)acrylate-based functional groups at the above-explained ratio, physical durability may be afforded by crosslinking, and thermal stability may be increased. In addition, the crosslinked fluorinated (meth)acrylate-based polymer has increased chemical durability such as not being dissolved in most organic solvents as well as a fluorine-containing solvent, and may planarize the surface of a deposition film to largely reduce average surface roughness.

If the ratio of deposition partial pressure of the following General Formula 1 of the reactive compound including at least two vinyl groups or (meth)acrylate-based functional groups to deposition partial pressure of the following General Formula 1 of the (meth)acrylate-based monomers substituted with a fluorine-containing functional group is too small, the formed polymer thin film may not have sufficient mechanical properties or chemical resistance and the like, thermal stability may decrease, and it may be difficult to lower average surface roughness.

If the ratio of deposition partial pressure of the following General Formula 1 of the reactive compound including at least two vinyl groups or (meth)acrylate-based functional groups to deposition partial pressure of the following General Formula 1 of the (meth)acrylate-based monomers substituted with a fluorine-containing functional group is too large, the formed polymer thin film may lose its original properties of a fluorinated polymer, rendering it difficult to afford sufficient water repellency and oil repellency, and the remaining amount of non-reacted functional groups may increase due to the excessively included functional groups, which may act as a cause of change according to passage of time, thus impeding stability of the polymer deposition film.

In the preparation method of one embodiment, a thermal initiator of a gas phase is thermally decomposed to form a radical which reacts with the monomer mixture to progress a chain polymerization reaction, thus synthesizing a polymer. The synthesized polymer is deposited on a predetermined substrate, thereby forming a polymer thin film. The formed radical reacts with the monomer mixture deposited on a predetermined substrate to progress a chain polymerization reaction, thus forming a polymer deposition thin film.

As the method for thermally decomposing a thermal initiator of a gas phase, commonly known methods may be used without specific limitations, but in order to progress more efficient polymerization, a metal filament heated and maintained at a high temperature may be used.

That is, in the method for preparing a polymer thin film of one embodiment, the step of thermally decomposing a thermal initiator of a gas phase to form a radical may include contacting the thermal initiator of a gas phase with a metal filament heated to a temperature of 150° C. to 500° C.

Specific examples of the thermal initiator are not specifically limited, but in order to apply for the vapor deposition, it is preferable to use an initiator that is liquid at room temperature or below decomposition temperature, and may be easily vaporized when heated above room temperature or decomposition temperature under subatmospheric pressure, to form a flow.

Specific examples of the thermal initiator may include peroxides, azo-based compounds, or a mixture thereof. Specific examples of the peroxides and azo-based compounds are not specifically limited, but examples of the peroxides may include di-tert-butyl peroxide, di-tert-amyl peroxide, and the like, and examples of the azo-based compounds may include 2,2'-azobis(2-methyl-propane), and the like.

The (meth)acrylate-based monomer substituted with a fluorine-containing functional group means a (meth)acrylate-based compound substituted with an organic functional group containing one or more, or three or more, fluorine atoms, and specific examples thereof may include C2-12 perfluoroalkyl (meth)acrylate, pentafluorophenyl (meth)acrylate, pentafluorobenzyl (meth)acrylate, or a mixture thereof.

More specific examples of the (meth)acrylate-based monomer substituted with a fluorine-containing functional group may include 1H,1H,2H,2H-perfluorodecyl(meth)acrylate, 1H,1H,2H,2H-perfluorooctyl(meth)acrylate, 1H,1H,2H,2H,5H-octafluoropentyl(meth)acrylate, pentafluorophenyl(meth)acrylate, and the like.

The reactive compound including at least two vinyl groups or (meth)acrylate-based functional groups may form a polymer thin film with higher mechanical properties, chemical resistance, heat resistance, or surface flatness in a vapor deposition process with the (meth)acrylate-based monomers substituted with a fluorine-containing functional group.

As the reactive compound including at least two vinyl groups or (meth)acrylate-based functional groups, compounds including at least two vinyl groups or (meth)acrylate-based functional groups and having vapor pressure of 1 mmHg to 100 mmHg at a temperature of 20° m to 200° C. may be used. Specific examples of the reactive compound including at least two vinyl groups or (meth)acrylate-based functional groups may include ethylene glycol di(meth)acrylate, diethylene glycol di(meth)acrylate, triethylene glycol di(meth)acrylate, ethylene glycol divinyl ether, diethylene glycol divinyl ether, triethylene glycol divinyl ether, divinyl benzene, and the like.

Meanwhile, the step of synthesizing the polymer and the step of depositing the synthesized polymer on a substrate may be simultaneously progressed. That is, the step of reacting the monomer mixture with the formed radical to form the polymer may be conducted on the substrate, and when the polymer is formed, the step of depositing on the substrate may also be progressed. Specifically, after the monomer mixture is absorbed on a substrate, it reacts with the formed radical to synthesize the polymer, and the synthesized polymer is deposited on the substrate, thereby forming a polymer thin film with water repellency and oil repellency.

In the step of depositing the synthesized polymer on a substrate, pressure may be 0.1 Torr to 1 Torr. If the deposition pressure is too low, deposition speed may become too slow or it may be difficult to sufficiently secure mechanical properties of the finally prepared polymer thin film. If the deposition pressure is too high, a gas phase reaction may excessively occur to cause problems such as generation of powder on the surface of a deposition thin film, and quality of the deposition surface may be degraded.

The method for preparing a polymer thin film of one embodiment may further include a step of vaporizing the (meth)acrylate-based monomers substituted with a fluorine-containing functional group, the reactive compound including at least two vinyl groups or (meth)acrylate-based functional groups, and the thermal initiator, separately or simultaneously, at a temperature of 20° C. to 200° C.

The method for preparing a polymer thin film of one embodiment may include introducing the vaporized (meth)acrylate-based monomers substituted with a fluorine-containing functional group, the vaporized reactive compound including at least two vinyl groups or (meth)acrylate-based functional groups, and the vaporized thermal initiator in the polymer synthesis step, such that flow rate of the vaporized thermal initiator to total flow rate of the vaporized (meth) acrylate-based monomers substituted with a fluorine-containing functional group and the vaporized reactive compound including at least two vinyl groups or (meth)acrylate-based functional groups may become 10% to 100%.

Devices and method that can be used in the vaporization step are not specifically limited, and for example, at least one of a direct heater such as a heating mantle, a heating band, a heating jacket, a heating box, a heating block, and the like, and an indirect heater such as a water bath may be used to heat a vessel containing the (meth)acrylate-based monomers substituted with a fluorine-containing functional group, the reactive compound including at least two vinyl groups or (meth)acrylate-based functional groups and the thermal initiator, and pressure may be reduced to process pressure or below process pressure through a pipe connecting the vessel and a deposition chamber, or a vacuum pump, thereby vaporizing the (meth)acrylate-based monomers substituted with a fluorine-containing functional group, the reactive compound including at least two vinyl groups or (meth) acrylate-based functional groups, and the thermal initiator, simultaneously or separately.

The (meth)acrylate-based monomers substituted with a fluorine-containing functional group, the reactive compound including at least two vinyl groups or (meth)acrylate-based functional groups and the thermal initiator, which have passed the vaporization step, may be introduced in the polymer synthesis step and the step of depositing the synthesized polymer on a substrate.

Specifically, the vaporized monomers, reactive compound, and thermal initiator may be introduced into a deposition chamber at a constant flow rate through a mass flow controller (MFC) Particularly, flow rate of material vaporized by heating above room temperature should be controlled through a MFC or a vapor MFC including a heater, so as to prevent condensation of gas in the flow controller.

A supply pipe connected from a vessel in which the monomers and reactive compound are vaporized to a deposition chamber should be maintained above a temperature at which the vessel is heated, and it is more preferable for transportation of vaporized material that the temperature of the supply pipe increases toward the deposition chamber. For example, a temperature gradient from the vessel in which the monomers and reactive compound are vaporized to the deposition chamber may be 0° C. to 50° C., or 5° C. to 20° C.

The flow rate of the monomers and the reactive compound are not specifically limited, but as the flow rate is higher, the deposition speed may increase. It is preferable to supply at a higher flow rate as the capacity of the deposition chamber is larger.

For example, in case a deposition chamber of about 30 l is used, it is preferable that the flow rates of the monomers and the reactive compound are controlled respectively in the range of 0.2 to 10 sccm (Standard Cubic Centimeters per Minute), and it is preferable that the initiator is introduced at a flow rate of 10% to 100% compared to the total flow rate of the monomers and the reactive compound. However, the details of the method for preparing a polymer thin film are not limited to such an example.

A specific kind of the substrate on which the synthesized polymer is deposited is not limited, but for example, it may be a silicon wafer, a glass substrate, a metal substrate, a polymer substrate, a battery separation membrane, an anode material or a cathode material of a battery, various membranes, a printed circuit board, an electrical device such as an LCD or an OLED and the like, or other microelectric devices and the like.

In the step of depositing the synthesized polymer on a substrate, the substrate may be maintained at a temperature of 20° C. to 100° C. below zero, or 0° C. to 60° C. below zero.

A temperature in the reactor in which deposition is progressed may be influenced by the temperature of the substrate, the temperature at which the step of thermally decomposing the thermal initiator of a gas phase to form a radical is progressed, the temperature of the polymer synthesis step or the temperature of a metal filament that can be used in the synthesis, and the like, and it may be about 20° C. to 200° C.

A time in which the step of depositing the synthesized polymer on a substrate and the like are progressed may be determined according to the thickness and physical properties of the finally prepared polymer thin film, and for example, it may be 10 seconds to 120 minutes, or 30 seconds to 60 minutes.

In the step of depositing the synthesized polymer on a substrate, process pressure of a deposition chamber may be maintained at 0.01 Torr to 10 Torr, or 0.1 Torr to 1 Torr.

The method for preparing a polymer thin film with water repellency and oil repellency of one embodiment may be conducted at a pressure of 0.1 Torr to 1 Torr.

According to another embodiment of the invention, a polymer thin film is provided, including: a polymer resin including (meth)acrylate-based repeat units substituted with a fluorine-containing functional group; and repeat units derived from a reactive compound including at least two vinyl groups or (meth)acrylate-based functional groups at a mole ratio of 100:10 to 100:80, and having a static contact angle of 120° or more with 3 µl of distilled water and a static contact angle of 80° or more with 3 µl of oleic acid.

A polymer thin film including a polymer resin including (meth)acrylate-based repeat units substituted with a fluorine-containing functional group, and repeat units derived from a reactive compound including at least two vinyl groups or (meth)acrylate-based functional groups at a mole ratio of 100:10 to 100:80, or 100:13 to 100:50, may have uniform physical properties and thickness over the whole area, and yet may have low average surface roughness and high durability and chemical resistance.

The polymer thin film may be prepared by the method for preparing a polymer thin film with water repellency and oil repellency of the one embodiment, and specifically, the polymer thin film may be prepared by chemical vapor deposition using a thermal initiator.

The details of the chemical vapor deposition using a thermal initiator include the above-explained contents regarding the method for preparing a polymer thin film with water repellency and oil repellency of the one embodiment.

In the polymer resin, the mole ratio of the (meth)acrylate-based repeat units substituted with a fluorine-containing functional group, and repeat units derived from a reactive compound including at least two vinyl groups or (meth) acrylate-based functional groups, may be 100:10 to 100:80, or 100:13 to 100:50.

If the mole ratio of the repeat units derived from a reactive compound including at least two vinyl groups or (meth) acrylate-based functional groups to the (meth)acrylate-based repeat units substituted with a fluorine-containing functional group is too small, the formed polymer thin film may not have sufficient mechanical properties or chemical resistance and the like, thermal stability may be lowered, and it may be difficult to lower average surface roughness.

If the mole ratio of the repeat units derived from a reactive compound including at least two vinyl groups or (meth) acrylate-based functional groups to the (meth)acrylate-based repeat units substituted with a fluorine-containing functional group is too large, the formed polymer thin film may lose its original properties of a fluorinated polymer, and thus may not have sufficient water repellency and oil repellency, and the remaining amount of non-reacted functional groups may increase due to the excessively included functional groups, which may act as a cause for change according to passage of time, thus impeding stability of the polymer deposition thin film.

The (meth)acrylate-based repeat unit substituted with a fluorine-containing functional group means a (meth)acrylate-based repeat unit substituted with an organic functional group containing one or more, or three or more, fluorine atoms, and as examples, it means a repeat unit derived from C2-12 perfluoroalkyl (meth)acrylate, pentafluorophenyl (meth)acrylate, pentafluorobenzyl (meth)acrylate, or a mixture of two or more kinds thereof.

The repeat unit derived from a reactive compound including at least two vinyl groups or (meth)acrylate-based functional groups means a repeat unit formed when the reactive compound including at least two vinyl groups or (meth)acrylate-based functional groups participates in a polymerization reaction. Specific examples of the reactive compound including at least two vinyl groups or (meth)acrylate-based functional groups may include ethylene glycol di(meth)acrylate, diethylene glycol di(meth)acrylate, triethylene glycol di(meth)acrylate, ethylene glycol divinyl ether, diethylene glycol divinyl ether, triethylene glycol divinyl ether, divinyl benzene, and the like.

The polymer thin film may have as high contact angle with organic components as well as water, thus realizing water repellency and oil repellency even at a flat surface, and when deposited on a surface such as a reverse tapered three-dimensional structure, it may realize excellent water repellency and oil repellency, thereby minimizing the amount of transferred pollutants and easily removing transferred pollutants.

Specifically, the polymer thin film may have high water repellency and oil repellency, and for example, it may have a static contact angle of 120° or more, or a static contact angle of 120° to 140°, with 3 µl of distilled water, and a static contact angle of 80° or more, or a static contact angle of 80° to 120°, with 3 µl of oleic acid.

Further, the polymer thin film may have a sliding angle of 30° or less, or 3° to 30°, with 30 µl of oleic acid. Since the polymer thin film has lower interaction energy with liquids or organic substances, it has a relatively small sliding angle with liquids.

For example, when 30 µl of oleic acid most similar to fingerprint components is put on the polymer thin film, an angle at which the oleic acid begins to slide down while making an angle of inclination with a horizontal plane, that is, a sliding angle, may be 30° or less, or 3° to 30°. That is, since the polymer thin film exhibits low interaction energy with organic components or moisture components and also exhibits a low sliding angle with the above components, the amount of pollutants transferred on the surface may be largely reduced, transferred pollutants may be prevented from remaining on the surface, and the pollutants may be easily removed.

The polymer thin film may have uniform surface properties, and specifically, average surface roughness of the polymer thin film may be 15 nm or less, or 0.1 nm to 15 nm. Further, the average surface roughness per 100 nm thickness of the polymer thin film may be 3 nm or less, or 0.1 nm to 3 nm.

As explained above, the polymer thin film may have high mechanical surface properties and heat resistance. Specifically, pencil hardness of the prepared polymer thin film, as measured using a 500 g weight according to ASTM D3363, may be HB or higher, or HB to 2H.

The polymer thin film may have a thickness of 10 nm to 1000 nm.

The polymer resin may have a weight average molecular weight of 10,000 to 1,000,000. If the weight average molecular weight of the polymer resin is too small, it may be difficult for the polymer thin film to secure sufficient mechanical properties, thermal stability, and chemical resistance.

The polymer resins may exist while crosslinked, and as the degree of crosslinking increases, the solubility of the polymer thin film to organic solvents may significantly decrease, and the weight average molecular weight of the polymer thin film may significantly increase. 발명의 효과

A polymer thin film with water repellency and oil repellency, which has uniform physical properties and thickness over the whole area, and yet has low average surface roughness and high durability and chemical resistance, and a method for preparing the polymer thin film, are provided.

Further, in the polymer thin film with water repellency and oil repellency, generation of by-products is insignificant, an additional high temperature annealing process is not required after formation of the polymer thin film, the formed thin film surface has uniform physical properties, and the remaining amount of non-reacted functional groups is insignificant, thus affording stable surface properties.

BRIEF DESCRIPTION OF THE DRAWINGS

FIG. 1 shows an atomic force microscope (AFM) image of the surface of the polymer thin film obtained in Example 1.

FIG. 2 shows an atomic force microscope (AFM) image of the surface of the polymer thin film obtained in Example 2.

FIG. 3 shows an atomic force microscope (AFM) image of the surface of the polymer thin film obtained in Example 3.

FIG. 4 shows an atomic force microscope (AFM) image of the surface of the polymer thin film obtained in Comparative Example 1.

FIG. 5 shows an atomic force microscope (AFM) image of the surface of the polymer thin film obtained in Comparative Example 2.

FIG. 6 shows an atomic force microscope (AFM) image of the surface of the polymer thin film obtained in Comparative Example 3.

FIG. 7 is a graph showing average surface roughness distribution per 100 nm thickness of the deposition film according to an EGDA/PFDA ratio.

FIG. 8 is a graph showing distribution of an oleic acid sliding angle according to an EGDA/PFDA ratio.

FIG. 9 shows comparison results of heat resistances of Example 1 and Comparative Example 2.

FIG. 10 shows measurement results of chemical resistances of the surfaces of the polymer thin films obtained in Example 1 and Comparative Example 1.

DETAILED DESCRIPTION OF THE EMBODIMENTS

Hereinafter, specific embodiments of the invention will be explained in detail with reference to the following examples. However, these examples are only to illustrate specific embodiments of the invention, and the scope of the invention is not limited thereto.

Example: Preparation of Polymer Thin Film

A deposition substrate of a silicon wafer was pretreated with oxygen plasma and positioned inside a hot wire chemical vapor deposition reactor. In the vapor deposition reactor, the temperature of the substrate surface was maintained at 20° C., a process pressure of 0.1 Torr was applied, and a nickel-chromium (8:2) hot wire was heated to 300° C.

Further, 1H,1H,2H,2H-perfluorodecyl acrylate and ethylene glycol diacrylate of a gas phase were respectively introduced into the vapor deposition reactor while controlling the introduction amount using a metering valve. Herein, the applied temperature for vaporizing the 1H,1H,2H,2H-perfluorodecyl acrylate (PFDA) and ethylene glycol diacrylate (EGDA) and the degree of opening of the metering valve are as shown in the following Table 1.

In the process of introducing the 1H,1H,2H,2H-perfluorodecyl acrylate and ethylene glycol diacrylate, vaporized tert-butyl peroxide was injected in an amount of 2 sccm using a mass flow controller.

In Examples 1 and 2, deposition was progressed for about 15 minutes, and in Example 3, deposition was progressed for 5 minutes, to prepare polymer thin films.

Comparative Example 1: Preparation of Polymer Thin Film

A polymer thin film was prepared by the same method as Example 1, except that the ethylene glycol diacrylate was not used, and the vaporization temperature and degree of opening of the metering valve as described in the following Table 1 were applied. Herein, in Comparative Example 1, deposition was progressed for about 30 minutes.

Comparative Examples 2 and 3: Preparation of Polymer Thin Films

Polymer thin films of Comparative Example 2 and Comparative Example 3 were prepared by the same method as Example 1, except that ethylene glycol diacrylate was introduced in a relatively very small amount or in a relatively excessive amount as described in the following Table 1. Herein, in Comparative Examples 2 and 3, deposition was progressed for about 15 minutes.

Experimental Example

Experimental Example 1: Analysis of Components of Deposition Film

The components of the deposition films were analyzed using X-ray photoelectron spectroscopy (XPS or ESCA; model name: ESCALAB 250(VG)) under the following system conditions.

TABLE 1

| System conditions | |
|---|---|
| Conditions | |
| Base chamber pressure | $3.0 \times 10^{-10}$ mbar |
| X-ray source | Monochromatic Al Kα (1486.6 eV) |
| X-ray spot size | 400 μm |
| Lens mode | LargeAreaXL |
| Operation mode | CAE (Constant Analyzer Energy) mode |
| Ar ion etching | Etching rate ~0.1 nm/sec (Mag 5, based on $SiO_2$) |
| Charge compensation | Low energy electron flood gun, 3 eV |

Survey and narrow data were obtained with the parameters described in the following Table 2, and qualitative and quantitative coupling analysis was conducted.

TABLE 2

| Element | Scan section binding energy | Step size (eV) | Dwell time | Number of scan | Pass energy |
|---|---|---|---|---|---|
| Survey | −5~1350 eV | 1 | 50 ms | 15 | 100 eV |
| Narrow | about ±15 eV, respectively | 0.1 | 50 ms | 15~20 | 30 eV |

\* Peak background: Shirley background, average: 1 eV

After a survey scan was conducted to qualitatively analyze whether or not C, O, and F atoms are contained, in order to confirm the mixing ratio of PFDA and EGDA, a narrow scan was conducted for a C 1s peak. Herein, in order to prevent confusion due to surface contamination, it was based on the contents detected within 10 nm in a depth direction from the surface.

Peaks corresponding to binding energy known through C 1s peak deconvolution were confirmed. Carbon peaks relating to the deposition film are as follows: —C—C*$H_2$—C—(285.0 eV), —C*H—CO—(285.7 eV), —O—C*$H_2$—$CH_2$—(286.7 eV), —$CH_2$—C*$H_2$—$CF_2$—(286.8 eV), —O—C*=O—(289.2 eV), —C*$F_2$—(291.2 eV), and —C*$F_3$—(293.3 eV). Herein, in PFDA, 7 —C*$F_2$—'s exist, and one —O—C*=O— exists per molecule. Further, since 2 O—C*=O—'s exist per molecule in EGDA, the area ratio of '—O—C*=O—'/'—C*F2—' in the peaks designated through C 1s peak deconvolution corresponds to '(PFDA mole number+EGDA mole number)/PFDA mole number'. From this, the mole ratios of 1H,1H,2H,2H-perfluorodecyl acrylate (PFDA) and ethylene glycol diacrylate (EGDA) in the polymer deposition film were respectively calculated and are shown in Table 3.

Experimental Example 2: Measurement of Surface Roughness

A scan was conducted for a 5 μm×5 μm area in a tapping mode using an atomic force microscope (large stage AFM (Veeco Inc. Dimension 3100)) to measure average surface roughnesses of the polymer deposition thin films obtained in the examples and comparative examples.

The atomic force microscope (AFM) images of the surfaces of the polymer thin films obtained in the examples and comparative examples are shown in FIGS. 1 to 6.

As shown in FIGS. 1 to 3, it was confirmed that the surfaces of the polymer thin films obtained in Examples 1 to 3 show very flat shapes. However, in the case of Example 2, although surface roughness rather increases due to a thickness increase, average surface roughness per unit thickness is similar to Example 3, as shown in Table 3. To the contrary, in the case of Comparative Example 1 of FIG. 4, surface roughness appeared to be very large, and in the case of Comparative Example 2 of FIG. 5, surface roughness increased because of too low containing ratio of the reactive compound including at least two vinyl groups or (meth) acrylate-based functional groups.

Average surface roughness distribution per 100 nm thickness according to EGDA/PFDA ratio is shown in FIG. 7. It can be seen that the ratio of EGDA/PFDA should be 0.10 or more so that the average surface roughness per 100 nm thickness of a deposition film may satisfy a level of 3 nm or less.

Experimental Example 3: Measurement of Static Contact Angle and Dynamic Contact Angle (1) Measurement of static contact angle By a tangent method, 3 μl of each of water and oleic acid were put on the surfaces of the polymer deposition thin films obtained in the examples and comparative examples, and static contact angles were measured using a DSA 100 measuring device.

As shown in Table 3, it was confirmed that in the case of Examples 1 to 3 containing a reactive compound (EGDA) including at least two vinyl groups or (meth)acrylate-based functional groups, the water contact angle and the oleic acid contact angle are not impeded, and water repellency and oil repellency equivalent to those of the polymer deposition film of Comparative Example 1 consisting only of (meth)acrylate-based monomers substituted with a fluorine-containing functional group are maintained.

(2) Measurement of dynamic contact angle

After putting 30 μl of oleic acid on the surfaces of the polymer deposition thin films obtained in the examples and comparative examples, while raising one side of the stage to form an angle of inclination in the film, a sliding angle at which the oleic acid slides down was measured using a DSA 100 measuring device by a tilting table method.

As shown in Table 3, in Comparative Example 3, the mole ratio of repeat units derived from a reactive compound (EGDA) including at least two vinyl groups or (meth) acrylate-based functional groups to the fluorine-containing functional group-substituted (meth)acrylate-based (PFDA) repeat units is too large, thus showing a high oleic acid sliding angle of 30° or more, which may be unfavorable for removal of surface contamination such as fingerprints. The distribution of the oleic acid sliding angle according to EGDA/PFDA ratio is shown in FIG. 8. The EGDA/PFDA ratio should be 0.8 or less so that oleic acid sliding angle may be 30° or less, when calculated according to the Equation ($y=19.619x+14.147$) obtained from the experiment results.

Experimental Example 4: Measurement of Mechanical Strength

According to ASTM D3363, using a pencil hardness tester, pencil hardnesses of the surfaces of the polymer deposition thin films obtained in the examples and comparative examples were measured using a 500 g weight.

As shown in Table 3, Comparative Example 1 wherein a reactive compound (EGDA) including at least two vinyl groups or (meth)acrylate-based functional groups is not included, and Comparative Example 2 wherein the containing ratio is too small, exhibited low mechanical strength of 3B or less, while Examples 1 to 3 wherein the containing ratio of the (meth)acrylate-based (PFDA) repeat substituted with a fluorine-containing functional group and the repeat units derived from a reactive compound (EGDA) including at least two vinyl groups or (meth)acrylate-based functional groups is 100:13 or more, exhibited pencil hardness of HB or higher.

Experimental Example 5: Measurement of Heat Resistance

The polymer deposited specimens obtained in examples and comparative examples were heated in a 250° C. oven, and then the states of the thin film surfaces before and after heating were observed with a microscope.

As shown in FIG. 9, on the surface of the polymer thin film of Example 1, there was no change before and after heating, while on the surface of the polymer thin film of Comparative Example 2, the surface shape was changed after heating. In the case of Comparative Example 2, although it is a crosslinked polymer film, since the mole ratio of the repeat units derived from a reactive compound (EGDA) including at least two vinyl groups or (meth) acrylate-based functional groups to the (meth)acrylate-based (PFDA) repeat units substituted with a fluorine-containing functional group is too small, the formed polymer thin film could not secure sufficient thermal stability.

Experimental Example 6: Measurement of Chemical Resistance 0.5 mL of hexafluoroisopropanol was added dropwise on the surfaces of the polymer deposition thin films of examples and comparative examples, and it was confirmed whether or not dissolution occurred.

As shown in FIG. 10, the surface of the polymer thin film of Example 1 was not dissolved in hexafluoroisopropanol, while the surface of the polymer thin film of Comparative Example 1 was dissolved immediately when hexafluoroisopropanol was added dropwise.

The results of the experimental examples are shown in Table 1.

TABLE 3

|  |  | Example 1 | Example 2 | Example 3 | Comparative Example 1 | Comparative Example 2 | Comparative Example 3 |
|---|---|---|---|---|---|---|---|
| Vaporization temperature | PFDA | 90 | 90 | 90 | 90 | 90 | 90 |
|  | EGDA | 70 | 90 | 90 | — | 70 | 90 |
| Scale of metering valve [based on 10] | PFDA | 7 | 7 | 7 | 9 | 7 | 7 |
|  | EGDA | 5 | 1 | 1 | — | 1 | 5 |
| Deposition thickness [nm] |  | 210 | 265 | 80 | 400 | 120 | 400 |

TABLE 3-continued

|  | Example 1 | Example 2 | Example 3 | Comparative Example 1 | Comparative Example 2 | Comparative Example 3 |
|---|---|---|---|---|---|---|
| EGDA/PFDA ratio | 0.34 | 0.165 | 0.15 | 0 | 0.095 | 0.9 |
| Surface roughness (Ra) [nm] | 3.0 | 7.7 | 2.2 | 18.9 | 10.5 | 4.1 |
| Roughness per 100 nm thickness [nm] | 1.4 | 2.9 | 2.8 | 4.7 | 8.8 | 1.0 |
| Water contact angle | 125.9 | 131.6 | 130.0 | 120.9 | 133.5 | 130.2 |
| Oleic acid contact angle | 94.2 | 97.1 | 91.4 | 89.7 | 99.2 | 96.1 |
| Oleic acid sliding angle | 20.6 | 17.2 | 16.9 | 13.9 | 16.5 | 31.9 |
| Pencil hardness | F | HB | HB | <6B | 3B | 3H |

What is claimed is:

1. A method for preparing a polymer thin film with water repellency and oil repellency comprising the steps of:
   thermally decomposing a thermal initiator of a gas phase to form a radical;
   reacting the formed radical with a monomer mixture comprising (meth)acrylate-based monomers substituted with a fluorine-containing functional group and a reactive compound comprising at least two vinyl groups or (meth)acrylate-based functional groups to synthesize a polymer; and
   depositing the synthesized polymer on a substrate,
   wherein a ratio of deposition partial pressure of the following General Formula 1 of the reactive compound comprising at least two vinyl groups or (meth)acrylate-based functional groups to deposition partial pressure of the following General Formula 1 of the (meth)acrylate-based monomers substituted with a fluorine-containing functional group is 0.13 to 0.50:

Deposition partial pressure=$P_m/P_{sat}$   [General Formula 1]

wherein, in the General Formula 1,
   Psat denotes saturation vapor pressure of corresponding monomers or compounds at a surface temperature of a substrate on which the synthesized polymer is deposited, and
   Pm denotes partial pressure of corresponding monomers or compounds in a reactor in which the deposition is progressed,
   wherein the prepared polymer thin film has a sliding angle of 30° or less with 30 μl of oleic acid, and
   wherein the prepared polymer thin film has pencil hardness of HB or higher, as measured using a 500 g weight according to ASTM D3363.

2. The method for preparing a polymer thin film with water repellency and oil repellency according to claim 1, wherein the prepared polymer thin film has a static contact angle of 120° or more with 3 μl of distilled water, and a static contact angle of 80° or more with 3 μl of oleic acid.

3. The method for preparing a polymer thin film with water repellency and oil repellency according to claim 1, wherein the prepare polymer thin film has a thickness of 10 nm to 1000 nm.

4. The method for preparing a polymer thin film with water repellency and oil repellency according to claim 1, wherein the step of thermally decomposing a thermal initiator of a gas phase to form a radical comprises contacting the thermal initiator of a gas phase with a metal filament heated to a temperature of 150° C. to 500° C.

5. The method for preparing a polymer thin film with water repellency and oil repellency according to claim 1, wherein the thermal initiator includes at least one selected from the group consisting of a peroxide and an azo-based compound.

6. The method for preparing a polymer thin film with water repellency and oil repellency according to claim 1, wherein the (meth)acrylate-based monomer substituted with a fluorine-containing functional group includes at least one selected from the group consisting of a C2-12 perfluoroalkyl, (meth)acrylate, pentafluorophenyl (meth)acrylate, and pentafluorobenzyl (meth)acrylate.

7. The method for preparing a polymer thin film with water repellency and oil repellency according to claim 1, wherein the reactive compound comprising at least two vinyl groups or (meth)acrylate-based functional groups includes at least one selected from the group consisting of ethylene glycol di(meth)acrylate, diethylene glycol di(meth)acrylate, triethylene glycol di(meth)acrylate, ethylene glycol divinyl ether, diethylene glycol divinyl ether, triethylene glycol divinyl ether, and divinylbenzene.

8. The method for preparing a polymer thin film with water repellency and oil repellency according to claim 1, further comprising a step of vaporizing the (meth)acrylate-based monomers substituted with a fluorine-containing functional group, the reactive compound comprising at least two vinyl groups or (meth)acrylate-based functional groups, and the thermal initiator, separately or simultaneously, at a temperature of 20° C. to 200° C.

9. The method for preparing a polymer thin film with water repellency and oil repellency according to claim 1, wherein in the step of depositing the synthesized polymer on a substrate, the substrate is maintained at a temperature of 0° C. to 60° C.

10. The method for preparing a polymer thin film with water repellency and oil repellency according to claim 1, wherein in the step of depositing the synthesized polymer on a substrate, a pressure is 0.1 Torr to 1 Torr.

11. The method for preparing a polymer thin film with water repellency and oil repellency according to claim 1, further comprising, before the step of synthesizing a polymer, a step of vaporizing the (meth)acrylate-based monomers substituted with a fluorine-containing functional group, the reactive compound comprising at least two vinyl groups or (meth)acrylate-based functional groups, and the thermal initiator, separately or simultaneously, at a temperature of 20° C. to 200° C.

12. The method for preparing a polymer thin film with water repellency and oil repellency according to claim 11, comprising a step of introducing the vaporized (meth)acrylate-based monomers substituted with a fluorine-containing functional group, the vaporized reactive compound comprising at least two vinyl groups or (meth)acrylate-based functional groups, and the vaporized thermal initiator in the polymer synthesis step, such that a flow rate of the vaporized thermal initiator to a total flow rate of the vaporized (meth)acrylate-based monomer substituted with a fluorine-containing functional group and the vaporized reactive compound comprising at least two vinyl groups or (meth)acrylate-based functional groups becomes 10% to 100%.

* * * * *